(12) United States Patent
Wang

(10) Patent No.: US 8,860,154 B2
(45) Date of Patent: Oct. 14, 2014

(54) CMOS COMPATIBLE SILICON DIFFERENTIAL CONDENSER MICROPHONE AND METHOD FOR MANUFACTURING THE SAME

(75) Inventor: Zhe Wang, Singapore (SG)

(73) Assignee: Goertek Inc., Weifang, Shandong (CN)

( * ) Notice: Subject to any disclaimer, the term of this patent is extended or adjusted under 35 U.S.C. 154(b) by 0 days.

(21) Appl. No.: 13/581,882

(22) PCT Filed: Mar. 11, 2011

(86) PCT No.: PCT/CN2011/071741
§ 371 (c)(1),
(2), (4) Date: Aug. 30, 2012

(87) PCT Pub. No.: WO2012/122696
PCT Pub. Date: Sep. 20, 2012

(65) Prior Publication Data
US 2014/0239352 A1   Aug. 28, 2014

(51) Int. Cl.
| | |
|---|---|
| *H01L 29/84* | (2006.01) |
| *G01P 15/08* | (2006.01) |
| *H04R 23/00* | (2006.01) |
| *G01L 9/00* | (2006.01) |
| *B81B 3/00* | (2006.01) |
| *H04R 19/04* | (2006.01) |
| *B81C 1/00* | (2006.01) |

(52) U.S. Cl.
CPC .............. *B81B 3/0078* (2013.01); *H04R 19/04* (2013.01); *B81C 1/00246* (2013.01); *B81B 2207/015* (2013.01)
USPC ........... 257/416; 257/254; 257/417; 257/418; 257/419; 257/420; 257/E29.324

(58) Field of Classification Search
USPC .......................... 257/254, 416–420, E29.324
See application file for complete search history.

(56) References Cited

U.S. PATENT DOCUMENTS

| | | | | |
|---|---|---|---|---|
| 5,490,220 | A * | 2/1996 | Loeppert ...................... | 381/355 |
| 7,570,775 | B2 * | 8/2009 | Araki ............................ | 381/191 |
| 7,812,418 | B2 * | 10/2010 | Hsu et al. ..................... | 257/419 |
| 7,933,428 | B2 * | 4/2011 | Sawada ........................ | 381/357 |
| 7,951,636 | B2 * | 5/2011 | Lee et al. ....................... | 438/53 |
| 8,173,471 | B2 * | 5/2012 | Hsieh et al. ................... | 438/53 |
| 8,263,426 | B2 * | 9/2012 | Ko et al. ........................ | 438/53 |
| 8,368,153 | B2 * | 2/2013 | Huang et al. ................. | 257/416 |
| 8,525,389 | B2 * | 9/2013 | Tan et al. ..................... | 310/328 |
| 8,590,136 | B2 * | 11/2013 | Yang et al. ..................... | 29/594 |
| 8,664,733 | B2 * | 3/2014 | Rombach ..................... | 257/416 |

(Continued)

*Primary Examiner* — Ida M Soward
(74) *Attorney, Agent, or Firm* — Troutman Sanders LLP

(57) ABSTRACT

The present invention provides a CMOS compatible silicon differential condenser microphone and a method of manufacturing the same. Said microphone comprises a silicon substrate, wherein a CMOS circuitry is accommodated thereon; a first rigid conductive perforated backplate supported on the silicon substrate with an insulating layer inserted therebetween; a second rigid perforated backplate formed above the first backplate, including CMOS passivation layers and a metal layer sandwiched between the CMOS passivation layers as an electrode plate of the second plate, wherein an air gap, with a spacer forming its boundary, is provided between the opposite perforated areas of the first backplate and the second backplate; a compliant diaphragm provided between the first backplate and the second backplate, wherein a back hole is formed to be open in the silicon substrate underneath the first backplate so as to allow sound pass through, and the diaphragm and the first backplate form a first variable condenser, the diaphragm and the second backplate form a second variable condenser, and the first variable condenser and the second variable condenser form differential condensers.

17 Claims, 9 Drawing Sheets

(56) References Cited

U.S. PATENT DOCUMENTS

| | | | |
|---|---|---|---|
| 2010/0072561 A1* | 3/2010 | Lee et al. | 257/415 |
| 2010/0164025 A1* | 7/2010 | Yang | 257/416 |
| 2011/0075865 A1* | 3/2011 | Yang et al. | 381/174 |
| 2011/0123043 A1* | 5/2011 | Felberer et al. | 381/94.2 |
| 2013/0221457 A1* | 8/2013 | Conti et al. | 257/416 |
| 2014/0008740 A1* | 1/2014 | Wang et al. | 257/416 |

* cited by examiner

S301

S303

S305

S307

S313

S315

CMOS COMPATIBLE SILICON DIFFERENTIAL CONDENSER MICROPHONE AND METHOD FOR MANUFACTURING THE SAME

BENEFIT CLAIMS

This application is a US National Stage of International Application No. PCT/CN2011/071741 filed 11 Mar. 2011.

FIELD OF THE INVENTION

The present invention relates to the field of microphone technology, and more specifically, to a CMOS compatible silicon differential condenser microphone and a method for manufacturing the same.

BACKGROUND

The silicon based MEMS microphones extensively used in hearing aids, mobile phones, digital cameras and toys are being pushed to their limits. The need is endless for a smaller, cheaper, robust microphone with a high sensitivity and a low noise level. Reducing the size of the microphone may deteriorate its performance, such as sensitivity. However, nowadays, micro-processing technologies provide a very good control over crucial dimensions and properties of the microphones, making further miniaturization and optimization of the microphone possible. Also, more complicated MEMS microphone principles can be applied, such as those with differential condensers and differential preamplifiers, allowing the performance of the MEMS microphone such as sensitivity to be maintained or improved.

In a non-patent document (Jesper Bay, Ole Hansen, and Siebe Bouwstra, Design of a silicon microphone with differential read-out of a sealed double parallel-plate capacitor, The 8th International Conference on Solid-State Sensors and Actuators, and Eurosensors IX, Stockholm, Sweden, Jun. 25-29, 1995), a sealed capacitive microphone with differential capacitive read-out and high sensitivity is provided, wherein the microphone consists of two diaphragms with a perforated center electrode in between, and the two diaphragms may be interconnected with pillars. This double diaphragm structure is disadvantageous in that it gives common mode change in capacitance, and the diaphragms are less compliant in case pillars are provided therebetween.

In another non-patent document (P. Rombach, M. Mullenborn, U. Klein and K. Rasmussen, The first low voltage, low noise differential condenser silicon microphone, The 14th European Conference on Solid-State Transducers, Aug. 27-30, 2000, Copenhagen, Denmark), a low voltage, low noise differential condenser silicon microphone is presented, which includes a non-planar structure and has all structural layers deposited consecutively and etched back separately to form the structure. However, this structure may not be suitable for integration with CMOS circuitry and/or flip-chip bonding.

In still another non-patent document (David T. Martin, Jian Liu, Karthik Kadirvel, Robert M. Fox, Mark Sheplak, and Toshikazu Nishida, A micromachined dual-backplate capacitive microphone for aeroacoustic measurements, Journal of Microelectromechanical Systems, Vol. 16, No. 6, December 2007), a micromachined dual-backplate capacitive microphone for aeroacoustic measurements is provided, in which three poly silicon layers are stacked as a single diaphragm and dual backplates, respectively, with the diaphragm sandwiched between the dual backplates. However, this structure cannot be CMOS compatible because of the three low stress poly silicon layers. Also, the three poly silicon plates of the microphone have slightly different radii, rendering the capacitances of the differential condensers a less simple relation.

Patent application International Publication Number WO 2007/089505 disclosed a differential microphone with a rotational diaphragm center-hinged, so that the diaphragm can rock back and forth around the hinge in response to an acoustic wave, thus forming two differential condensers. The microphone is characterized in that it obviates the need for creating a backside chamber, however, the rock of the diaphragm depends on sound wave direction, and there is no perforated backplate for reduction of air damping. Also, such structure may not be proper to be integrated with other CMOS conditioning circuits.

Patent application Publication Number US 2008/0089536 showed a microphone microchip device, in which an additional matching capacitor is offered in order to differentiate the capacitance of the microphone condenser, and a differential receiver is employed to process the difference between the microphone signal and a substantially fixed voltage.

Therefore, there is a need for a CMOS-compatible monolithic silicon microphone chip with differential sensing to increase the signal-to-noise ratio performance, and a method for manufacturing the same.

SUMMARY

In order to solve the above problems, the present invention provides a CMOS compatible silicon differential condenser microphone and a method for manufacturing the same. With this CMOS compatible silicon differential condenser microphone, the signal-to-noise ratio of the microphone can be increased. Further, such a differential capacitive microphone sensor is compatible to CMOS processing, and can be fabricated and integrated with pre-amplifiers and/or differential amplifier integrated circuits as a monolithic chip.

In an aspect of the present invention, there is provided a CMOS compatible silicon differential condenser microphone, including: a silicon substrate, wherein a CMOS circuitry is accommodated thereon; a first rigid conductive perforated backplate formed on the silicon substrate, wherein the outskirts of the first backplate are supported on the silicon substrate with an insulating layer inserted therebetween; a second rigid perforated backplate formed above the first backplate, including CMOS passivation layers and a metal layer sandwiched between the CMOS passivation layers as an electrode plate of the second backplate; a compliant diaphragm formed with a CMOS compatible layer and provided between the first backplate and the second backplate; a first air gap separating the first backplate and the diaphragm and a second air gap separating the diaphragm and the second backplate, wherein both air gaps are bounded with a spacer provided between the first backplate and the second backplate; a back hole formed to be open in the silicon substrate underneath the first backplate so as to allow sound pass through, wherein the diaphragm and the first backplate form a first variable condenser, the diaphragm and the second backplate form a second variable condenser, and the first variable condenser and the second variable condenser form differential condensers.

In one embodiment, the CMOS compatible silicon differential condenser microphone of the present invention may further comprise an interconnection column provided between the diaphragm and the second backplate for mechanically suspending and electrically wiring out the diaphragm, wherein the interconnection column includes a CMOS passivation layer sidewalled CMOS dielectric oxide strut, and a via metal passing therethrough and electrically connecting the diaphragm to the metal layer formed within the second backplate, and wherein the diaphragm is centrally connected to the interconnection column and isolated from the remaining parts of the microphone by a slit at the perimeter of the diaphragm.

In another embodiment, the outskirts of the diaphragm may be suspended to the second backplate by the sidewalls surrounding the second air gap between the diaphragm and the second backplate, wherein the sidewalls are formed with the CMOS passivation layers.

Furthermore, in one or more embodiments, the CMOS circuitry accommodated on the silicon substrate may comprise a charge pump circuit producing a bias voltage which is applied to the diaphragm; a first source follower pre-amplifier electrically connected to the first backplate; a second source follower pre-amplifier electrically connected to the second backplate; wherein, the outputs of the first and the second source follower preamplifiers form a differential voltage output when the diaphragm vibrates in response to an input sound pressure signal.

In another aspect of the present invention, there is provided a method for manufacturing a CMOS compatible silicon differential condenser microphone, comprising: forming an insulating layer on a silicon substrate; forming a first perforated backplate on the insulating layer formed on the silicon substrate; depositing a first CMOS dielectric oxide layer on the first perforated backplate; forming a diaphragm by depositing a CMOS compatible layer on the CMOS dielectric oxide layer, wherein the diaphragm is aligned with the first perforated backplate; depositing a second CMOS dielectric oxide layer on the first CMOS dielectric oxide layer and the diaphragm; forming isolation walls by sequentially trench etching in the second and first CMOS dielectric oxide layers and depositing a first CMOS passivation layer to confine a spacer separating the first and the second backplates, and isolation walls in the second CMOS dielectric oxide layer connecting between the diaphragm to the second backplate; forming a second backplate on the second CMOS dielectric oxide layer by sequentially depositing a patterned metal layer and a second CMOS passivation layer, and etching a plurality of perforations therein opposite to the diaphragm, wherein the second backplate is aligned with the diaphragm; forming a back hole by removing a portion of the silicon substrate and the insulating layer underneath the first backplate; and forming a first air gap between the first backplate and the diaphragm and a second air gap between the diaphragm and the second backplate by removing the portions of the first and the second CMOS dielectric oxide layers other than those confined by the plurality of isolation walls.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Figure 1:
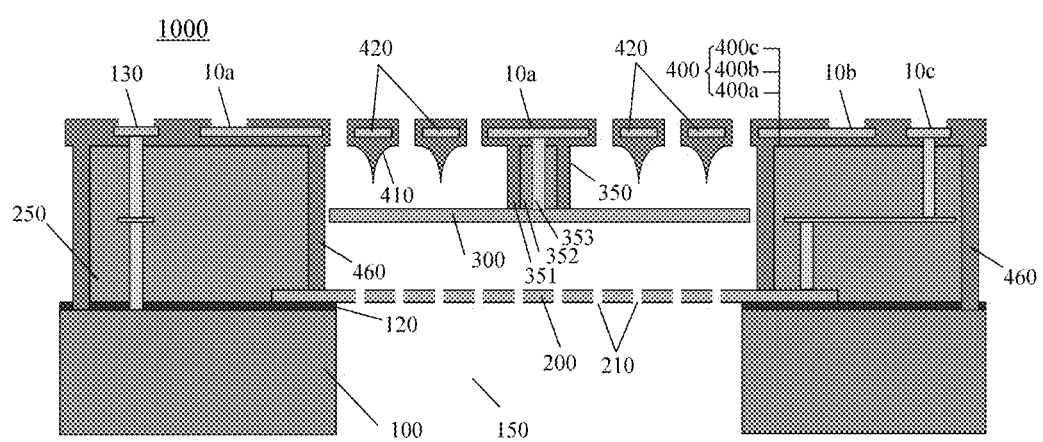
FIG. 1 is a cross-sectional view showing the structure of the CMOS compatible silicon differential condenser microphone according to a first embodiment of the present invention.

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

The First Embodiment

Thereinafter, the structure of the CMOS compatible silicon differential condenser microphone according to a first embodiment of the present invention will be described with reference to FIG. 1.

FIG. 1 is a cross-sectional view showing the structure of the CMOS compatible silicon differential condenser microphone 1000 according to the first embodiment of the present invention. As shown in FIG. 1, the CMOS compatible silicon microphone 1000 according to the first embodiment of the present invention may include a silicon substrate 100, a lower backplate 200, a spacer 250, a compliant diaphragm 300, an interconnection column 350, and an upper backplate 400. The diaphragm 300 and the lower backplate 200 form a lower variable condenser, the diaphragm 300 and the upper backplate 400 form an upper variable condenser, and the lower variable condenser and the upper variable condenser form differential condensers.

The silicon substrate 100 is used to support the lower backplate 200 and spacer 250, as shown in FIG. 1. Further, the silicon substrate 100 may also be used to accommodate CMOS circuits thereon, which are not shown in FIG. 1.

The lower backplate 200 is a rigid conductive perforated backplate formed with composite layers of, for example, a first poly silicon layer, oxide and/or nitride layer(s) and a second poly silicon layer, wherein the oxide or nitride layer(s) sandwiched by the first poly silicon layer and the second poly silicon layer can provide a rigid backplate. The outskirts of the lower backplate 200 are supported on the Si substrate 100 with an insulating layer 120, made of for example silicon oxide and/or nitride, inserted therebetween. The lower backplate 200 herein may correspond to the first rigid conductive perforated backplate mentioned above.

A back hole 150 is formed in the silicon substrate 100 to expose the lower backplate 200 to the ambient, so that the sound may pass the silicon substrate 100 and the lower backplate 200 through the back hole 150 formed in the silicon substrate 100 and the perforations 210 formed in the lower backplate 200 to reach the diaphragm 300. The conductive lower backplate 200 may function as an electrode plate of the differential condensers, i.e. the sensing element of the microphone 1000.

The spacer 250 is made of CMOS dielectric oxide, such as low pressure chemical vapor deposition (LPCVD) or plasma enhanced chemical vapor deposition (PEVCD) silicon oxide, phospho-silicate-glass (PSG) or boro-phospho-silicate-glass (BPSG) or a combination thereof, and provided between the lower backplate 200 and the upper backplate 400 (described later). Furthermore, the spacer 250 may be provided with isolation walls 460, which are formed of a CMOS dielectric passivation layer such as a silicon nitride layer, on both inner and outer lateral sides thereof. An air gap, with the spacer 250 forming its boundary, is formed between the opposite perforated areas of the lower backplate 200 and the upper backplate 400.

The upper backplate 400 is a rigid conductive perforated backplate formed on the spacer 250, including CMOS passivation layers 400a and 400c, which are made of for example PECVD silicon nitrides, and a patterned metal layer 400b sandwiched between the CMOS passivation layers 400a and 400c. The CMOS passivation layers 400a and 400c may protect the sandwiched metal layer 400b from corrosion in a corrosive or humid environment and from any electrical leakage. The metal layer 400b may include an electrode plate 420 of the upper backplate 400 and its extraction electrode 10b, an extraction electrode 10a of the diaphragm 300, an extraction electrode 10c of the lower backplate 200 and, optionally, an extraction electrode 130 of the silicon substrate 100. Also, the upper backplate 400 is perforated in the portion opposite to the diaphragm 300 for air ventilation so as to reduce air resistance that the diaphragm 300 will encounter when starts vibrating. The electrode plate 420 forms another electrode plate of the differential condensers, i.e. the sensing element of the microphone 1000.

The compliant diaphragm 300 is formed with conductive SiGe or other CMOS compatible layers and provided between the lower backplate 200 and the upper backplate 400, wherein the air gap between the lower backplate 200 and the upper backplate 400 is split into a lower air gap (i.e, the first air gap) separating the lower backplate 200 and the diaphragm 300 and an upper air gap (i.e., the second air gap) separating the diaphragm 300 and the upper backplate 400. SiGe is advantageously used herein instead of poly silicon, since it can be deposited at a lower temperature (lower than 400° C.), which does not affect pre-formed CMOS devices. The compliant diaphragm 300 is mechanically and electrically connected at the center thereof to the upper backplate 400 via the interconnection column 350, and is otherwise isolated from the remaining parts of the microphone 1000 by a slit at the perimeter of the diaphragm 300. The diaphragm 300 may have circular, square, rectangular or polygonal shape. Further, the diaphragm 300 may have other suitable shape.

The interconnection column 350 is provided between the diaphragm 300 and the upper backplate 400 for mechanically suspending and electrically wiring out the diaphragm 300. The interconnection column 350 may include a CMOS passivation layer 351 sidewalled CMOS dielectric oxide 352 strut, and a via metal 353 passing therethrough and electrically connecting the diaphragm 300 and the metal layer 400b formed in the upper backplate 400.

The portions of the lower backplate 200 and the upper backplate 400 opposite to the diaphragm 300 preferably have equal areas and same perforations, and the lower air gap and the upper air gap preferably have equal thicknesses, so that the capacitance between the diaphragm 300 and the lower backplate 200 equals to the capacitance between the diaphragm 300 and the upper backplate 400, which is advantageous in eliminating common mode noise. In another example, the portions of the lower backplate 200 and the upper backplate 400 opposite to the diaphragm 300 may not have equal areas and same perforations, and the lower air gap and the upper air gap may not have equal thicknesses.

Furthermore, in order to prevent the diaphragm 300 from sticking to the upper backplate 400 caused either by surface tension during the formation, i.e. the wet release process (described later), or by sound pressure and electrostatic force during the operation, the CMOS compatible silicon differential condenser microphone 1000 according to the first embodiment of the present invention may further include a plurality of sharp-tipped dimples 410 protruding from the lower surface of the upper backplate 400 opposite to the diaphragm 300. Correspondingly, other measures may be adopted to prevent the diaphragm 300 from sticking to the lower backplate 200, for example, by increasing the separation therebetween.

Selectively, a ground contact 130 may be formed for the purpose of for example reduction of light sensitivity when the sound port is made on the backside of the differential condenser microphone according to the present invention.

The CMOS circuits accommodated on the silicon substrate, which are mentioned above and not shown in FIG. 1, are used to process electrical signals obtained after acoustic-electrical conversion. In one example, the CMOS circuits may include a charge pump circuit producing a bias voltage which is applied to the diaphragm 300, a first source follower pre-amplifier electrically connected to the lower backplate 200, and a second source follower pre-amplifier electrically connected to the upper backplate 400, which are integrated with the sensing element comprised of the diaphragm, the upper backplate, and the lower backplate on the same silicon substrate. The outputs of the first and second source follower preamplifiers form a differential voltage output when the diaphragm vibrates in response to an input sound pressure signal. Further, in another example, the CMOS circuitry may further include a differential amplifier (not shown), wherein the output terminals of the first and second source follower preamplifiers are further electrically connected to a first and second input of the differential amplifier, respectively.

Figure 2:
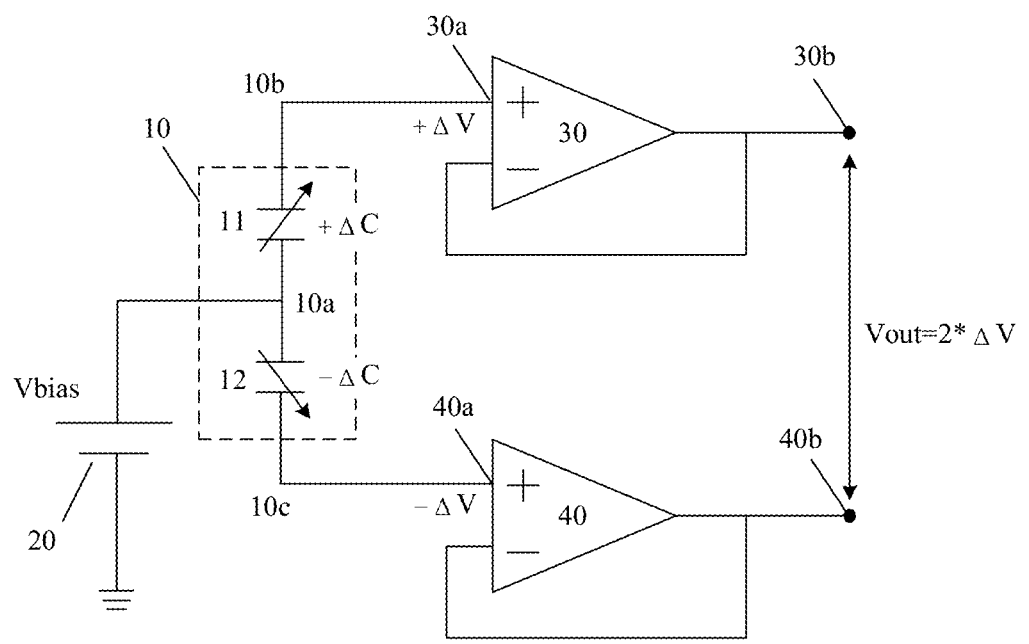
FIG. 2 is a schematic view showing an equivalent circuit of an example CMOS compatible silicon differential condenser microphone according to the first embodiment of the present invention.

FIG. 2 is a circuit diagram showing an equivalent circuit of an example CMOS compatible silicon differential condenser microphone 1000 according to the first embodiment of the present invention, in this example, the CMOS circuitry includes a charge pump circuit, a first source follower pre-amplifier and a second source preamplifier.

As shown in FIG. 2, the circuit includes a pair of variable differential condensers 11 and 12 representing the upper variable condenser formed by the diaphragm 300 and the upper backplate 400 and the lower variable condenser formed by the diaphragm 300 and the lower backplate 200, respectively; a power source 20 representing the charge pump circuit producing a bias voltage Vbias, which is applied to the common plate 10a (corresponding to the extraction electrode 10a of the diaphragm 300 as shown in FIG. 1) shared by the pair of variable differential condensers 11 and 12; an first operational amplifier 30 provided with a negative feedback loop and representing the first source follower pre-amplifier, wherein the input terminal 30a thereof is electrically connected to the other plate 10b (corresponding to the extraction electrode 10b of the upper backplate 400 as shown in FIG. 1) of the variable differential condenser 11; and an second operational amplifier 40 provided with a negative feedback loop and representing the second source follower pre-amplifier, wherein the input terminal 40a thereof is electrically connected to the other plate 10c (corresponding to the extraction electrode 10c of the lower backplate 200 as shown in FIG. 1) of the variable differential condenser 12. Thus, the outputs 30b and 40b of the first and the second source follower preamplifiers 30 and 40 form a differential voltage output Vout.

The sensing element 10 of the microphone according to the present invention, modeled as the pair of variable differential condensers 11 and 12, consists of three parallel plates, i.e. a vibrating diaphragm, a fixed and perforated upper backplate and a fixed and perforated lower backplate. The diaphragm is located between the two backplates and is preferably equidistant thereto so that an upper and a lower parallel plate condenser are formed with the diaphragm shared by the two condensers. With such an arrangement, when the diaphragm vibrates in response to an input sound pressure signal, the upper and the lower condensers will change in opposite direction. That is, if the change of the separation between the two plates of the condenser 11 is $\Delta d$, then that of the condenser 12 will be $-\Delta d$. Since the absolute value of the capacitance increment of a condenser is proportional to the absolute value of the separation increment of the condenser, a vibration of the diaphragm gives a differential change of the capacitances of the upper and lower condensers, i.e. if the change of the capacitance of the condenser 11 is $\Delta C$, then that of the condenser 12 will be $-\Delta C$.

A simple calculation shows that, with above described configuration, the absolute value of the potential increment at the input terminal 30a of the first source follower pre-amplifier 30 is, among others, substantially proportional to the bias voltage Vbias supplied by the charge pump circuit 20 and to the absolute value of the increment of the separation between the two plates of the condenser 11. The same is true for the condenser 12. Since the charge pump circuit 20 may raise the Vbias to more than 10 V, which is higher than the operating voltage for normal IC devices, the adoption of the charge pump circuit 20 can greatly improve the sensitivity of the microphone according to the present invention. Furthermore, if the potential variation at the input terminal 30a of the first source follower pre-amplifier 30 is $\Delta V$, then the potential variation at the input terminal 40a of the second source follower pre-amplifier 40 will be $-\Delta V$, and vice versa, thus, the differential voltage output Vout formed by the outputs 30b and 40b of the first and the second source follower preamplifiers 30 and 40 will be $2*\Delta V$, which is twice the sensitivity of an ordinary microphone without differential output.

It should be noted that, although it is preferred in above discussion that the diaphragm is equidistant to and/or same sized with the upper and the lower backplates of the sensing element, it is not indispensable. The same principle still works in case that the diaphragm is not equidistant to and/or same sized with the upper and the lower backplates of the sensing element. Furthermore, since the sensing element has a small capacitance which translates to be very high in impedance, the two source followers may function actually as impedance converters with or without amplification.

Hereinafter, a method of manufacturing the above described the CMOS compatible silicon differential condenser microphone 1000 according to the first embodiment of the present invention will be described with reference to FIG. 3A through FIG. 3L. FIG. 3A through FIG. 3L are cross-sectional views showing a method of manufacturing the CMOS compatible silicon differential condenser microphone 1000 according to the first embodiment of the present invention. In the following description, for sake of clarity and conciseness, a lot of processing details, such as equipments, conditions, parameters and so on, are omitted in considering that they are well known to those skilled in the art.

Figure 3A:
FIG. 3A through FIG. 3L are cross-sectional views showing a method of manufacturing the CMOS compatible silicon differential condenser microphone according to the first embodiment of the present invention.

In Step S301, as shown in FIG. 3A, grow thick thermal oxide 110 on a silicon substrate 100 to form an etching stop layer for a back hole 150 etching (described later). Thermal oxide is advantageous over ordinary deposited oxide or nitride in forming a stop layer for the back hole 150 etching.

Figure 3B:
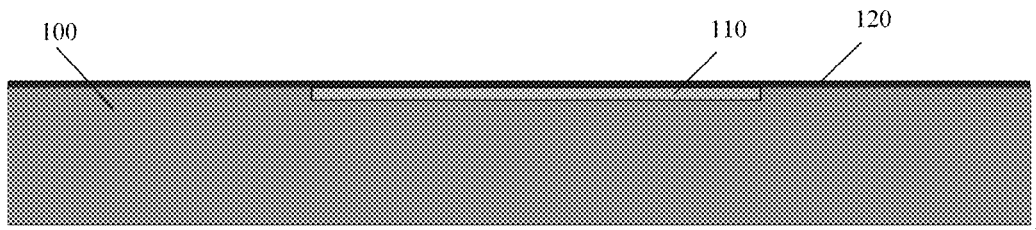

In Step S303, as shown in FIG. 3B, deposit insulating layer(s) 120, such as silicon oxide and silicon nitride dielectric layers, on the top surface of the silicon substrate 100 and the thermal oxide layer 110.

Figure 3C:
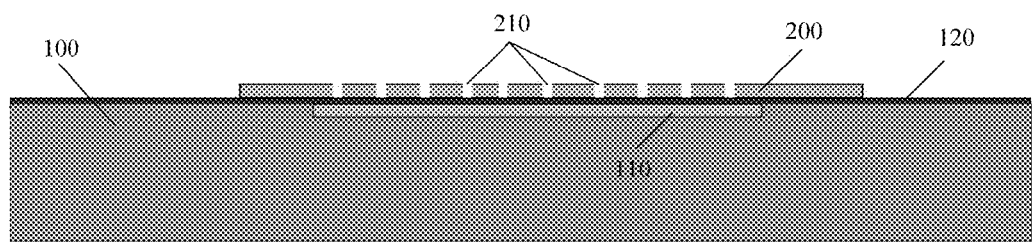

In Step S305, as shown in FIG. 3C, deposit composite layers of a first poly silicon layer, oxide and/or nitride layer(s) and a second poly silicon layer on the insulating layer 120, and then etch a plurality of perforations 210 on the deposited composite layers to form the lower backplate 200, wherein the lower backplate 200 is vertically aligned with the thermal oxide layer 110.

Figure 3D:
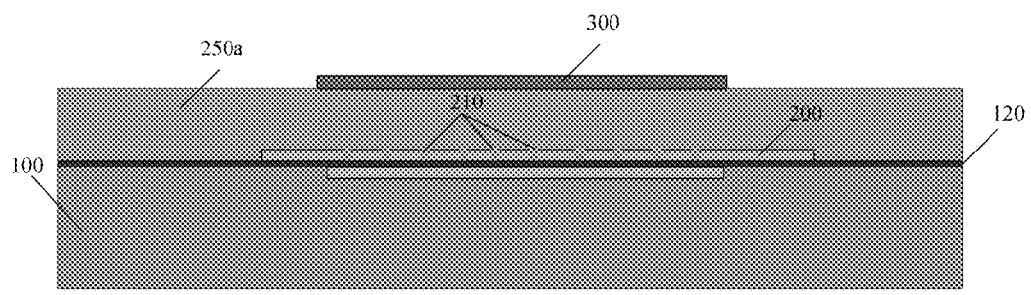

In Step S307, as shown in FIG. 3D, deposit a first CMOS dielectric oxide layer 250a, such as LPCVD or PECVD oxide, PSG or BPSG, on the lower perforated backplate 200 and the insulating layer 120, and then deposit a SiGe or other CMOS compatible layers on the CMOS dielectric oxide layer 250a to form a diaphragm 300, wherein the diaphragm 300 is vertically aligned with the lower backplate 200.

Figure 3E:
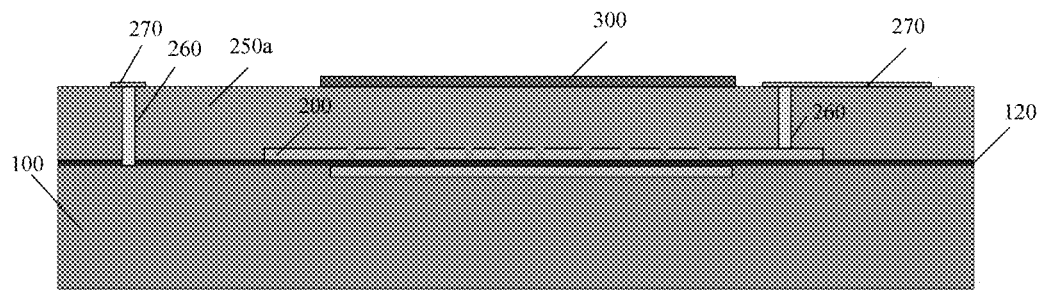

In Step S309, as shown in FIG. 3E, etch via holes in the CMOS dielectric oxide layer 250a and fill the via holes with metal such as copper, aluminum, titanium to form via metals 260, and then deposit metal pads 270 on top of the via metal 260 so as to extract ohmic contacts to the silicon substrate 100 and to the lower backplate 200.

Figure 3F:
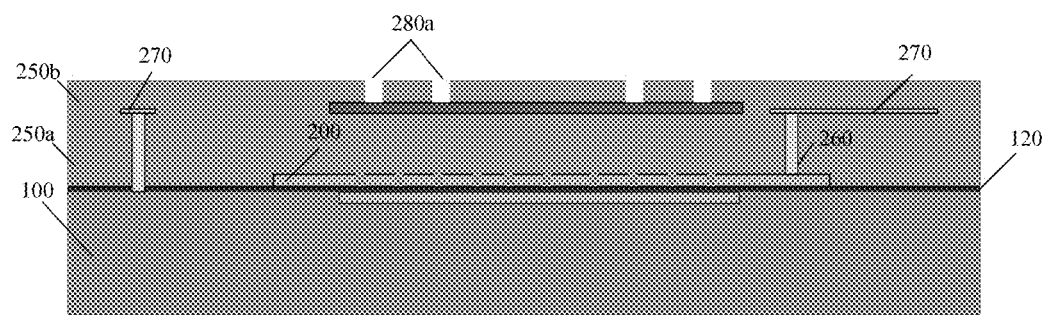

In Step S311, as shown in FIG. 3F, deposit a second CMOS dielectric oxide layer 250b on the first CMOS dielectric oxide layer 250a, the diaphragm 300, and the metal pads 270, form a plurality of shallow trenches 280a in the CMOS dielectric oxide layer 250b above the diaphragm 300.

Figure 3G:
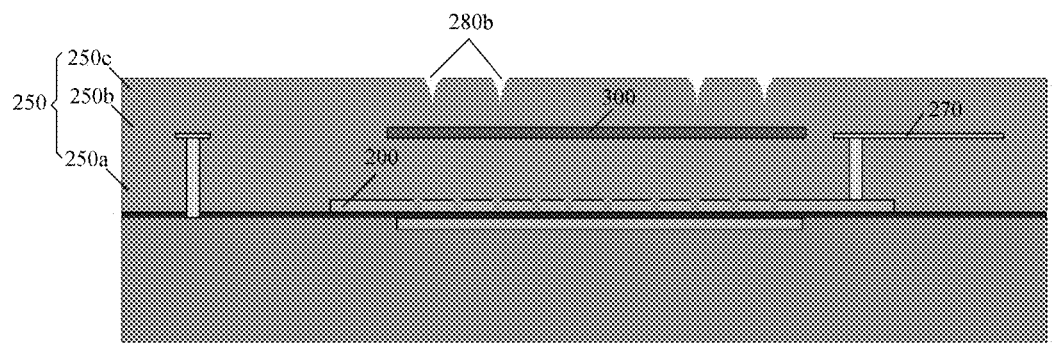

In Step S313, as shown in FIG. 3G, deposit a third CMOS dielectric oxide layer 250c so that a plurality of sharp-tipped pits 280b are conformally formed on the surface of the CMOS dielectric oxide layer 250c, corresponding to the plurality of shallow trenches 280a.

Figure 3H:
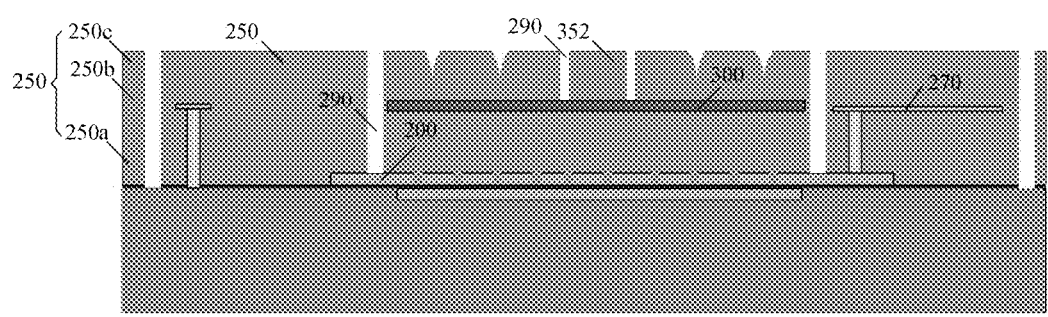

In Step S315, as shown in FIG. 3H, etch trenches 290 in the CMOS dielectric oxide layers deposited in the above steps, so as to define a spacer 250 separating the lower and the upper backplates 200 and 400, and define a column 352 connecting the center of the diaphragm 300 to the second backplate 400, wherein the spacer 250 is overlapped with the outskirts of the lower backplate 200.

Figure 3I:
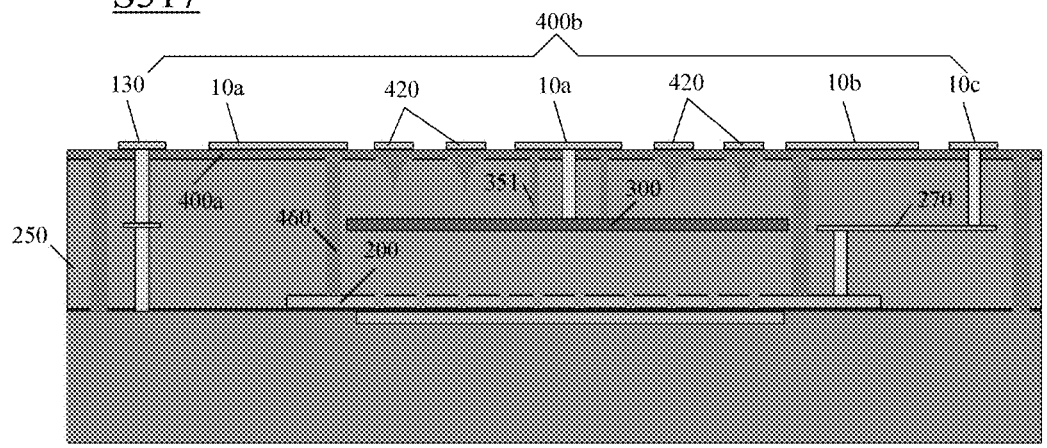

In Step S317, as shown in FIG. 3I, deposit for example PECVD silicon nitride to form isolation walls 460 of the spacer 250 and an isolation wall 351 of the column 352 by filling the trenches 290 and to form a first CMOS passivation layer 400a of the upper backplate 400, and then form via metal in the spacer 250 and in the column 352 to wire out the lower backplate 200, the diaphragm 300, and, optionally, the substrate 100, and form a patterned metal layer 400b on the first CMOS passivation layer 400a comprising an perforated electrode plate 420 of the upper backplate 400 and its extraction electrode 10b, an extraction electrode 10a of the diaphragm 300, an extraction electrode 10c of the lower backplate 200 and, optionally, an extraction electrode 130 of the silicon substrate 100.

Figure 3J:
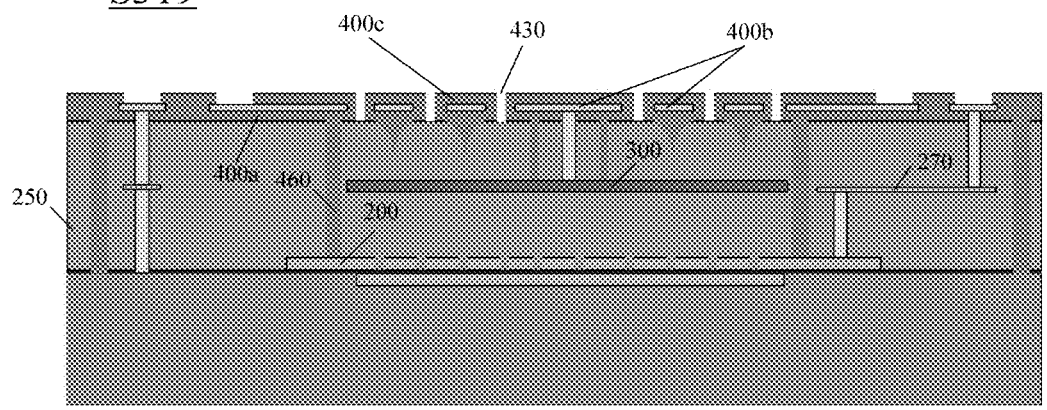

In Step S319, as shown in FIG. 3J, deposit a second CMOS passivation layer 400c to complete the formation of the upper backplate 400, and etching a plurality of perforations 430 in the upper backplate 400 opposite to the diaphragm 300.

Figure 3K:
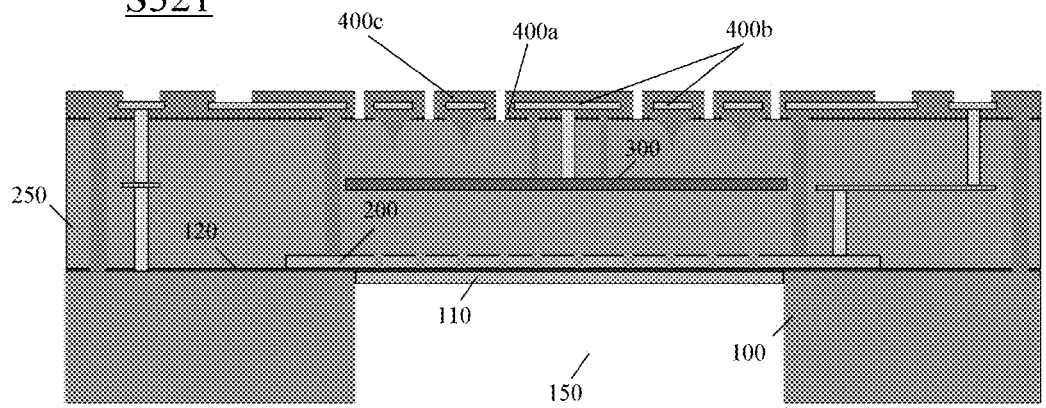

In Step S321, as shown in FIG. 3K, form a back hole 150 by etching the portions of the silicon substrate 100 underneath the lower backplate 200 with the thermal oxide layer 110 as a stop layer.

Figure 3L:
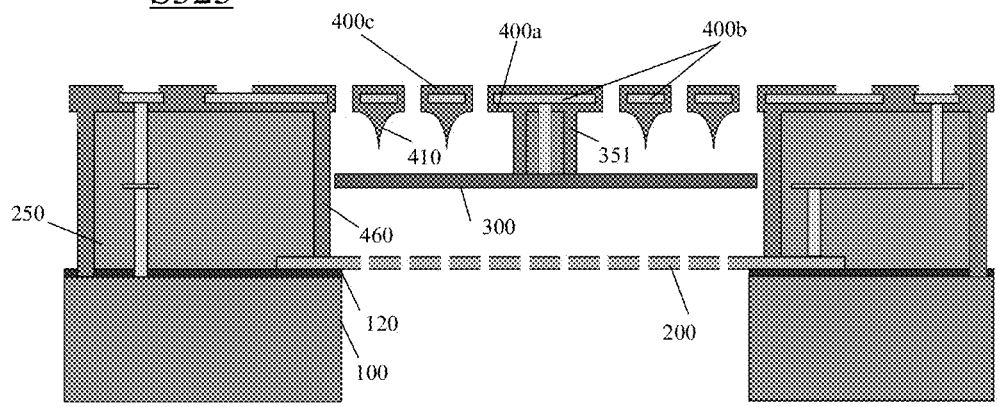

In Step S323, as shown in FIG. 3L, remove the stop layer 110 and the portion of the insulating layer 120 thereon, and release the sacrificial layer composed of the portions of the CMOS dielectric oxide layers 250a, 250b and 250c other than those confined by the plurality of isolation walls 460 and 351, thus form a lower air gap between the lower backplate 200 and the diaphragm 300 and an upper air gap between the diaphragm 300 and the upper backplate 400, wherein the outskirts of the diaphragm 300 is separate from other parts of the sensing element 10 by a slit adjacent to the perimeter of the diaphragm 300, and at the same time, a plurality of sharp-tipped dimples 410 opposite to the diaphragm 300 are formed.

It should be noted that the above described process is only a process for manufacturing the CMOS compatible silicon differential condenser microphone according to a preferred embodiment of the present invention. Various modification and variation can be made for the embodiment without departing the spirit of the present invention. For example, one or more steps in the above process may be omitted. In an alternative embodiment, no dimples are formed so that the step of forming trenches 280a on the second CMOS dielectric oxide layer 250b and depositing the third CMOS dielectric oxide layer 250c to form the sharp-tipped pits 280b may be obviated. In another alternative embodiment, the step S301 may be omitted.

It should be noted that, during the above steps, the method of manufacturing the CMOS compatible silicon differential condenser microphone 1000 according to the present invention may further comprises: forming a charge pump circuit 20 producing a bias voltage which is applied to the diaphragm 300; forming an first source follower pre-amplifier 30, the input of which is electrically connected to the upper backplate 400; and forming a second source follower pre-amplifier 40, the input of which is electrically connected to the lower backplate 200. The outputs of the first and the second source follower preamplifiers 30 and 40 form a differential voltage output when the diaphragm 300 vibrates in response to an input sound pressure signal.

Selectively, during above steps, the method of manufacturing the CMOS compatible silicon differential condenser microphone according to the present invention may further comprises: forming a differential amplifier, wherein the output terminals of the first and the second source follower preamplifiers 30 and 40 are electrically connected to a first input and a second input of the differential amplifier, respectively.

It should be noted that, in present invention, the sensing element comprising the diaphragm, the lower backplate and the upper backplate, and the charge pump circuit, the first source follower pre-amplifier and the second source follower pre-amplifier are formed on the same silicon substrate 100.

The CMOS compatible silicon differential condenser microphone and the method of manufacturing the same according to the first embodiment have been described with reference to FIG. 1 to FIG. 3.

The advantages of the CMOS compatible silicon differential condenser microphone as above are in that for required microphone sensitivity, the signal-to-noise ratio can be raised by 3 dB by reducing 3 dB of pull-up gain, and the microphone overall noise performance can be improved due to differential output. Furthermore, in case that the CMOS circuits accommodated on the silicon substrate further includes a differential amplifier, the affect of the ripple noise of the bias circuit on the differential output Vout may be suppressed, which is double susceptible to the ripple noise of the bias circuit due to the differential condenser arrangement described above.

The Second Embodiment

Now, the structure of the CMOS compatible silicon differential condenser microphone 1000' according to the second embodiment of the present invention will be described with reference to the FIG. 4. Comparing FIG. 4 with FIG. 1, the second embodiment of the present invention is distinguished from the first one only in that, in the second embodiment, the outskirts of the diaphragm 300 are suspended to the upper backplate 400, the interconnection column 350 connecting the center of the diaphragm 300 to the upper backplate 400 in the first embodiment as shown in FIG. 1 becomes interconnection walls 350' located at outskirts of the diaphragm 300 in the second embodiment as shown in the FIG. 4, and a via metal 353' is formed in the spacer 250, connecting the outskirts of the conductive diaphragm 300 to the extraction electrode 10a formed in the upper backplate 400 so as to wire out the diaphragm 300. The remaining portions of the CMOS compatible silicon differential condenser microphone 1000' are same as those of microphone 1000 shown in FIG. 1, and the detailed description thereof is omitted herein.

Figure 4:
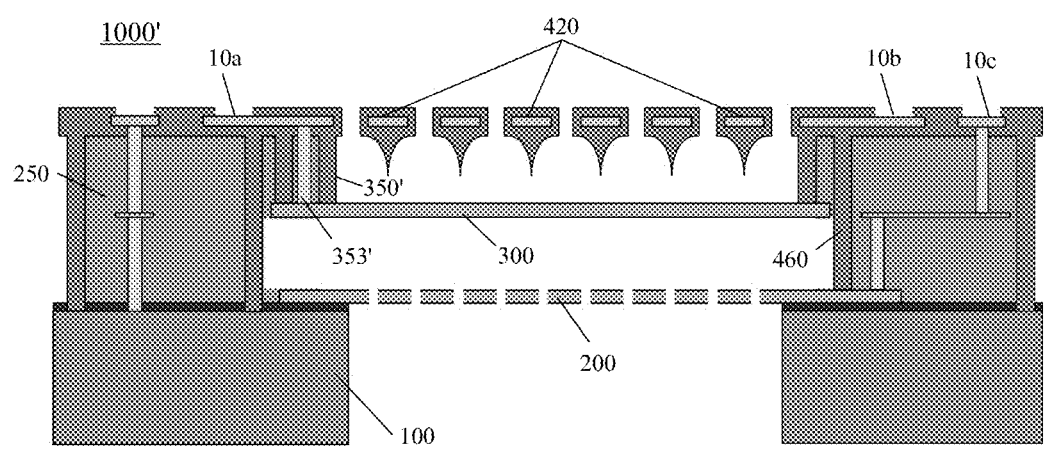
FIG. 4 is a cross-sectional view showing the structure of the CMOS compatible silicon differential condenser microphone according to a second embodiment of the present invention.

It is apparent that the same method of manufacturing the CMOS compatible silicon differential condenser microphone according to the first embodiment of the present invention may also be applied to the CMOS compatible silicon differential condenser microphone according to the second embodiment of the present invention, except that the interconnection portions 350 and 350' shown in the FIG. 1 and FIG. 4, which are formed during Step S315-S319 between the diaphragm 300 and the upper backplate 400, are differently formed in the two embodiments, that is, in the first embodiment, the interconnection portion 350 is formed at the center of the diaphragm 300, while in the second embodiment, the interconnection portions 350' are formed on the outskirts of the diaphragm 300.

It should be noted that a circular shape for the CMOS compatible silicon differential condenser microphone according the present invention is normally preferred, but other shapes like square, rectangular or other polygonal shapes are possible.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A CMOS compatible silicon differential condenser microphone, comprising:
   a silicon substrate, wherein a CMOS circuitry is accommodated thereon;
   a first rigid conductive perforated backplate formed on the silicon substrate, wherein the outskirts of the first backplate are supported on the silicon substrate with an insulating layer inserted therebetween;
   a second rigid perforated backplate formed above the first backplate, including CMOS passivation layers and a metal layer sandwiched between the CMOS passivation layers as an electrode plate of the second plate;

a compliant diaphragm formed with a CMOS compatible layer and provided between the first backplate and the second backplate;

a first air gap separating the first backplate and the diaphragm and a second air gap separating the diaphragm and the second backplate, wherein both air gaps are bounded with a spacer provided between the first backplate and the second backplate;

a back hole formed to be open in the silicon substrate underneath the first backplate so as to allow sound pass through, wherein the diaphragm and the first backplate form a first variable condenser, the diaphragm and the second backplate form a second variable condenser, and the first variable condenser and the second variable condenser form differential condensers.

2. The CMOS compatible silicon differential condenser microphone of claim 1, further comprising:

an interconnection column provided between the diaphragm and the second backplate for mechanically suspending and electrically wiring out the diaphragm, wherein the interconnection column includes a CMOS passivation layer sidewalled CMOS dielectric oxide strut, and a via metal passing therethrough and electrically connecting the diaphragm and the metal layer formed within the second backplate, and the diaphragm is centrally connected to the interconnection column and isolated from the remaining parts of the microphone by a slit at the perimeter of the diaphragm.

3. The CMOS compatible silicon differential condenser microphone of claim 1, wherein the outskirts of the diaphragm are suspended to the second backplate by the sidewalls surrounding the second air gap between the diaphragm and the second backplate, wherein the sidewalls are formed with the CMOS passivation layers.

4. The CMOS compatible silicon differential condenser microphone of claim 1, wherein the diaphragm is formed with a Silicon Germanium (Si/Ge) layer or other CMOS compatible layers, and the first rigid conductive perforated backplate is formed with composite layers of a first poly silicon layer, oxide and/or nitride layer(s) and a second poly silicon layer.

5. The CMOS compatible silicon differential condenser microphone of claim 1, wherein the spacer is formed with CMOS dielectric oxide and protected by CMOS passivation layer sidewalls, the insulating layer includes silicon oxide and/or nitride, the CMOS dielectric oxide includes LPCVD or PEVCD silicon oxide, PSG or BPSG oxide or a combination thereof, and the CMOS passivation layers include PECVD silicon nitrides.

6. The CMOS compatible silicon differential condenser microphone of any one of claims 1 to 4, wherein the portions of the first backplate and the second backplate opposite to the diaphragm have equal areas and same perforations, and the first air gap and the second air gap have equal thicknesses.

7. The CMOS compatible silicon differential condenser microphone of any one of claims 1 to 4, wherein the diaphragm has circular, square, rectangular, or polygonal shape.

8. The CMOS compatible silicon differential condenser microphone of any one of claims 1 to 4, further comprising a plurality of sharp-tipped dimples protruding from the lower surface of the second backplate opposite to the diaphragm.

9. The CMOS compatible silicon differential condenser microphone of any one of claims 1 to 4, wherein the CMOS circuitry comprises:

a charge pump circuit producing a bias voltage which is applied to the diaphragm;

a first source follower pre-amplifier electrically connected to the first backplate;

a second source follower pre-amplifier electrically connected to the second backplate;

wherein, the outputs of the first and the second source follower preamplifiers form a differential voltage output when the diaphragm vibrates in response to an input sound pressure signal.

10. The CMOS compatible silicon differential condenser microphone of claim 9, wherein the CMOS circuitry further comprises a differential amplifier, wherein the output terminals of the first and the second source follower preamplifiers are further electrically connected to a first input and a second input of the differential amplifier, respectively.

11. A method for manufacturing the CMOS compatible silicon differential condenser microphone of claim 1, comprising:

forming an insulating layer on a silicon substrate;

forming a first perforated backplate on the insulating layer formed on the silicon substrate;

depositing a first CMOS dielectric oxide layer on the first perforated backplate;

forming a diaphragm by depositing a CMOS compatible layer on the CMOS dielectric oxide layer, wherein the diaphragm is aligned with the first perforated backplate;

depositing a second CMOS dielectric oxide layer on the first CMOS dielectric oxide layer and the diaphragm;

forming isolation walls by sequentially etching trench in the first and second CMOS dielectric oxide layers and depositing a first CMOS passivation layer to confine a spacer separating the first and the second backplates, and isolation walls in the second CMOS dielectric oxide connecting between the diaphragm and the second backplate;

forming a second backplate on the second CMOS dielectric oxide layer by sequentially depositing a patterned metal layer and a second CMOS passivation layer, and etching a plurality of perforations therein opposite to the diaphragm, wherein the second backplate is vertically aligned with the diaphragm;

forming a back hole by removing a portion of the silicon substrate and the insulating layer underneath the first backplate; and forming a first air gap between the first backplate and the diaphragm and a second air gap between the diaphragm and the second backplate by removing the portions of the first and the second CMOS dielectric oxide layers other than those confined by the plurality of isolation walls.

12. The method of claim 11, wherein the first perforated backplate is formed by depositing composite layers of a first poly silicon layer, oxide and/or nitride layer(s) and a second poly silicon layer, and the diaphragm is formed by depositing a Silicon Germanium (Si/Ge) layer.

13. The method of claim 11, wherein during the step of forming the isolation walls in the second CMOS dielectric oxide, an interconnecting column is also formed at the center of the diaphragm, wherein via metals are formed to wire out the diaphragm.

14. The method of claim 11, wherein during the step of forming the isolation walls in the second CMOS dielectric oxide, sidewalls is also formed surrounding the edges of the diaphragm, wherein via metals are formed outside the sidewalls to wire out the diaphragm.

15. The method of claim 11, wherein a thick thermal oxide layer is formed in the silicon substrate and covered by the insulating layer so as to provide a stop layer for the back hole etching.

16. The method of claim 11, wherein during the step of forming the second backplate, via metals are also formed in the spacers, and in the interconnection column or outside the isolation walls to wire out the first backplate and the diaphragm.

17. The method of claim 11, after the step of depositing a second CMOS dielectric oxide layer on the first CMOS dielectric oxide layer and before the step of forming isolation walls, further comprises:
- forming a plurality of shallow trenches in the second CMOS dielectric oxide layer above the diaphragm;
- depositing a third CMOS dielectric oxide layer;
- wherein a plurality of sharp-tipped pits are conformally formed on the surface of the third CMOS dielectric oxide layer, corresponding to the plurality of shallow trenches, such that a plurality of sharp-tipped dimples are formed opposite to the diaphragm during the step of the forming isolation walls and forming the second backplate.

* * * * *